United States Patent [19]

Landsness et al.

[11] 4,347,477
[45] Aug. 31, 1982

[54] MAT TESTING APPARATUS

[75] Inventors: Clifford A. Landsness; Thomas M. Buehrle, both of Akron, Ohio

[73] Assignee: The B.F. Goodrich Company, New York, N.Y.

[21] Appl. No.: 178,483

[22] Filed: Aug. 15, 1980

[51] Int. Cl.³ .......................................... G01R 31/12
[52] U.S. Cl. ...................................................... 324/54
[58] Field of Search ...................... 324/54, 52; 340/647

[56] References Cited

U.S. PATENT DOCUMENTS

| | | | |
|---|---|---|---|
| 2,890,409 | 6/1959 | Van Krevelen | 324/54 |
| 2,941,144 | 6/1960 | Cannon | 324/54 |
| 3,321,703 | 5/1967 | Tyszewicz | 324/54 |
| 3,857,091 | 12/1974 | Kalifon | 324/54 X |
| 3,919,635 | 11/1975 | Bowen et al. | 324/54 |
| 3,955,136 | 5/1976 | Wiltshire et al. | 324/54 |
| 4,247,814 | 1/1981 | Landsness et al. | 324/54 |

FOREIGN PATENT DOCUMENTS 1313992   4/1973   United Kingdom ................. 324/54

Primary Examiner—Stanley T. Krawczewicz
Attorney, Agent, or Firm—Joseph Januszkiewicz

[57] ABSTRACT

A mat testing apparatus having an enclosed test chamber with a pair of moveable electrode plates that are cooperative with two pairs of vertically disposed stationary electrode plates. Such pairs of plates are cooperative to define a clearance space between each pair which are operative to receive a portion of a mat material for testing its non-conductivity to a high electrical charge. Feed means are provided to index a predetermined length of matting to the respective clearance spaces between each pair of plates to test spaced portions of a mat. Take-up means are provided at the end of the feed means for wind-up of the mat material.

5 Claims, 4 Drawing Figures

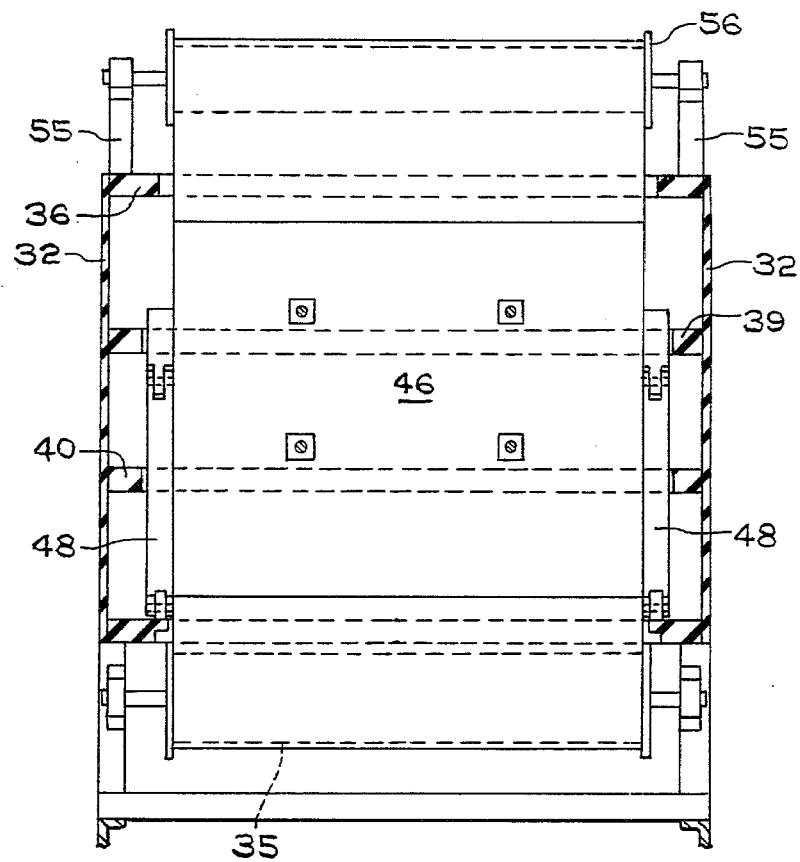
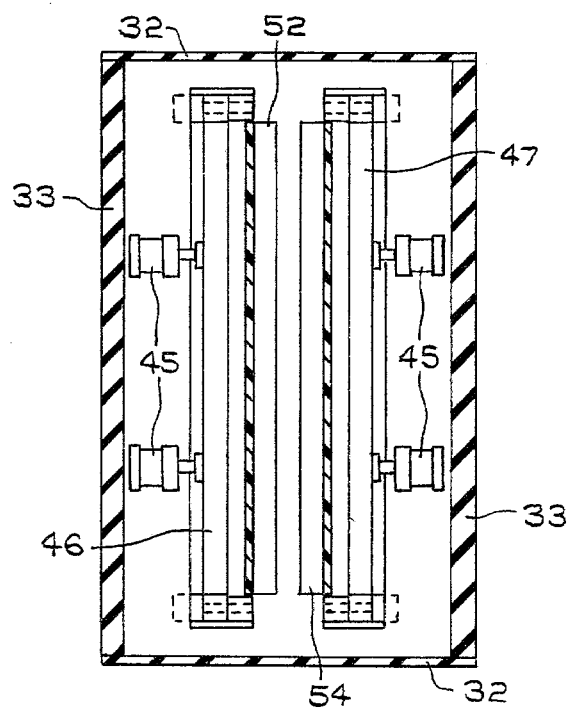

MAT TESTING APPARATUS

BACKGROUND OF THE INVENTION

This invention relates to a new and improved apparatus for testing the non-conductance of rubber matting under the application of high voltage.

Where electrical repairs are made in areas that have good conductive substances such as steel or metal, it is necessary to provide a mat that is relatively thin and lightweight on which the repairman may stand. Such mat must be portable so that it can be rolled out for use in a prescribed area and thence rerolled and carried to the next location or packed conveniently for moving to the next location. It is necessary that such matting withstand high voltage. Such matting is also very useful in areas such as decks of ships where there are control panels and switch gears to provide proper insulation of the power stations. Heretofore, such matting would be manually unrolled and small sections of the matting would be tested for its resistance to the application of a high voltage. After one section or a portion of the roll is tested, the roll is manually manipulated such as to position a new section for testing. Such process is slow and tedious. A further recent method and apparatus used a pair of spaced rolls that intermittently tested a predetermined length of matting as it was transferred from one roll to the second roll. The present invention provides means for automatically testing spaced portions of matting to a high voltage charge and thence advance the matting to test a further pair of spaced sections or portions. This test procedure is continued until the entire length is tested with provision being made to overlap small portions to assure complete testing of the entire matting. The present invention materially increases the rate of testing.

SUMMARY OF THE INVENTION

The present invention contemplates an apparatus for applying a high voltage charge in seriatim order to successive spaced portions of an electrical non-conductive matting such as a rubber mat as it unwound from a supply roll to a take-up roll. Provisions are made to overlap the testing of the successive spaced strips or portions of the matting to assure a testing of the full length of the matting.

BRIEF DESCRIPTION OF THE DRAWINGS

FIG. 3 is an enlarged cross sectional view of the high voltage testing chamber taken on line 3—3 of FIG. 1.

FIG. 4 is an enlarged fragmentary plan view of the high voltage testing chamber taken on line 4—4 of FIG. 1.

DETAILED DESCRIPTION

Figure 1:
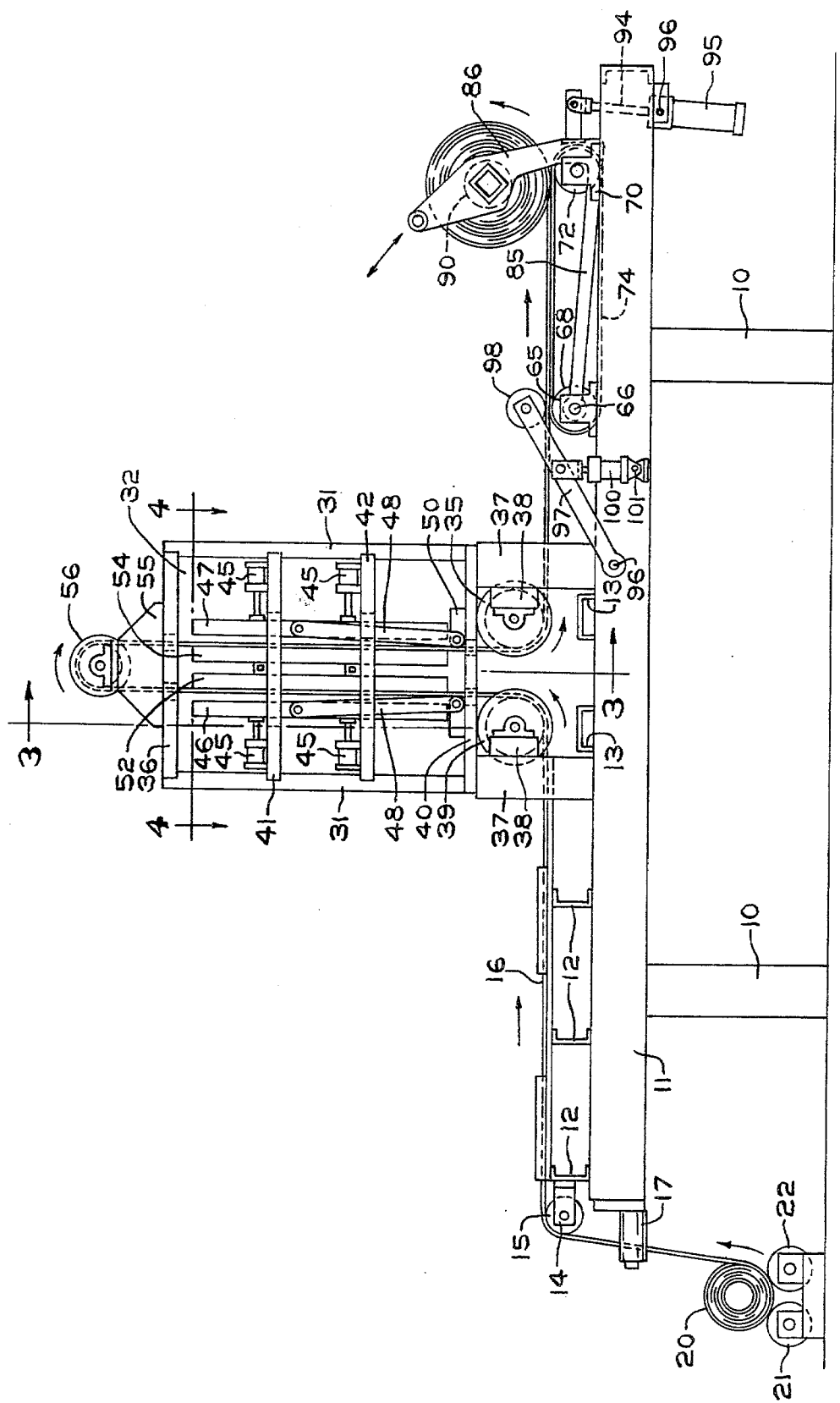
FIG. 1 is a side-elevational view of the mat testing apparatus.
Figure 2:
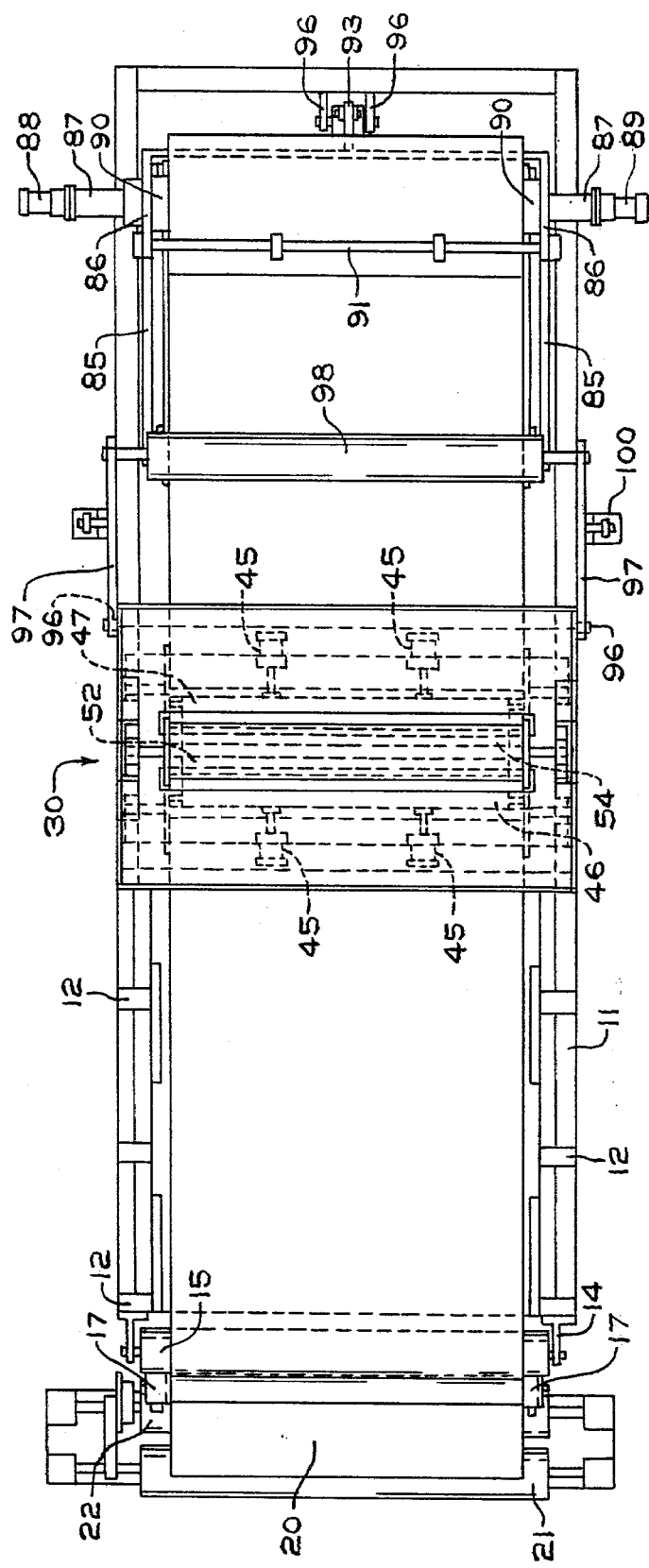
FIG. 2 is a plan view of the mat testing apparatus.

Referring to the drawings, wherein like reference numerals designate like or corresponding parts throughout the several views, there is shown in FIG. 1 a plurality of vertical supports 10 supporting brackets 11 which in turn supports cross braces 12 and channel beams 13. Mounted on one of the cross braces 12 is a pair of spaced brackets 14 journaling for rotatation a guide roller 15 over which matting 16 is guided. Side guide roller 17—17 cooperate with the guide roller 15 to guide the matting as it passes from the supply roll 20 to the high voltage testing chamber to be described. Supply roll 20 is supported by a pair of spaced idler rollers 21-22 to facilitate the unwinding of the matting as it is advanced in a manner to be described.

Suitably mounted over channel beams 13 is a test chamber 30 composed of vertical frame members 31 supporting transparent side windows 32 and transparent end windows 33 (FIG. 4) such as clear polycarbonate. The upper ends of windows 32 and windows 33 are supported by an upper plate member 36. Members 31 and 36 cooperate with windows 32 to define the high voltage testing chamber 30. Test chamber 30 is supported by vertical braces 37 on which are mounted journal bearings 38. Transfer rollers 39 are rotatably mounted between pairs of axially spaced bearings 38. Extending horizontally between the vertically extending frame members 31 are lower cross braces 40, upper cross braces 41 and intermediate braces 42.

Suitably mounted on horizontally extending braces 41 and 42 are pneumatic cylinders 45. The rod end of the cylinders 45 are secured to a pair of electrically conductive plates or electrode platens 46-47. A suitable electrical power source for supplying a high voltage is connected to plates 46 and 47. Suitable limit switches are mounted on the braces 41 and 42 and are operative to be actuated by abutments on the piston rods of the cylinders 45 to facilitate the sensing and control of the platen's movement in a manner to be described.

The intermediate side of each plate or platen 46 and 47 is pivotally connected to one end of a lever arm 48. The other end of each lever arm 48 is suitably pivotally connected to lower cross braces 40. With the pressurization of the head end of the cylinders 45, the respective plates 46 and 47 are moved toward each other while pressurization of the rod end of each cylinder 45 moves the plates 46 and 47 away from each other, with lever arms 48 freely supporting such plates to facilitate such movements.

Rigidly secured to the horizontally extending braces 41 and 42 are a pair of vertically extending electrically conductive plates or electrode platens 52 and 54. Plates 46 and 52 are cooperative to test a section of dielectric material therebetween while plates 47 and 54 are cooperative to test another section of dielectric material therebetween at the same time.

Upper plate member 36 supports a pair of spaced brackets 55 which journal between them a roller 56 which operates to redirect the dielectric material being tested from plates 46 and 52 to plates 47 and 54. Plate member 36 has suitable apertures to facilitate the movement of the dielectric material therethrough.

Suitably mounted on brackets 11 adjacent to the discharge end of high voltage testing chamber 30 are a pair of journals 65 which receive the shaft 66 journaling for rotation roller 68. Also mounted on brackets 11 at the rearwardmost end portion of the support frame are a pair of journals 70 supporting idler roller 72. Trained about rollers 68 and 72 is an endless belt 74 to facilitate the movement of the matting for windup in a manner to be described.

Suitably mounted on the bottom framework of the apparatus described is a motor not shown that drives roller 66. Such motor that drives roller 66 is energized by suitable control means old and well known in the arts to advance the matting material in a manner to be described.

Journaled on shaft 67 for pivotal movement are a pair of L-shaped spaced lever arm members 85 which leg portions 86 suppot a housing member 87 on which is mounted pneumatic cylinders 88 and 89 cylinders 88 and 89 are operative to actuate chuck means to release or mount a wind-up roller 90 that provide the support for the winding up of the matting thereabout. The respective ends of leg portions 86 are interconnected by a rod 91. The rear of leg portions 86 adjacent to lever arm members 85 are connected to a bracket 96, which in bracket 93 in turn is connected to a piston rod 94 of a pneumatic cylinder 95. Cylinder 95 is pivotally connected to braces 96 such that energization of the head end of cylinder 95 pivots lever arm members 85 counterclockwise about shaft 66 as seen in FIG. 1, which lifts the matting roll 90 (FIG. 1) upwardly out of contact with the belt 74 and roller 72; whereas exhausting of the head end of cylinder 95 allows the matting being wound about the core on shaft 90 to rest on the belt 74 in contact with the roller 72. The windup of the matting onto roller 90 would automatically compensate for its increase in diameter to provide a constant peripheral speed.

Pivotally mounted as at 96 on the spaced brackets 11 adajcent to one cross channel beam 13 is a pair of spaced lever arm members 97 which support for rotation a roller 98. A pair of spaced pneumatic cylinder 100 have their respective head ends pivotally secured as at 101 to supporting brackets 11. The respective piston rods of cylinder 100 are pivotally connected to the intermediate portion of lever arm member 97 for raising and lowering lever arm members 97 and idler roller 98 supported therebetween.

In the operation of the mat tester, a roll of matting on a roller is placed between rollers 21 and 22 with the leader therefrom extending over roller 15 and fed into the test chamber 30, under roller 39 and between plates 46 and 52, over roller 56, thence between plates 47 and 54, under rollers 36 and thence between rollers 68 and 98 for attachment to the roller 90 which is supported by the leg portions 86 of arm members 85. The apparatus is now in a condition to test the insulating factor of the mat material at two spaced locations. The head end of cylinders 45 are actuated to move the respective spaced plates 46 and 47 into contact with the mat material whose opposite sides are supported by platens 52 and 54. A voltage such as 15,000 volts A.C. is applied from a suitable source to the respective plates 46 and 47. If the mat material is defective, a current will flow through the material to one of the grounded platens 52 or 54 which condition will be observed on the ammeter connected to the respective platens 52 or 54. Where no current flow is indicated after the prescribed time lapse, the rod end of pneumatic cylinders 45 are actuated which moves the respective electrode plates 46 and 47 out of contact with the matting in the test chamber 30, permitting the advancement of the matting such that new sections of matting are brought into position for testing by plates 46 and 47 with a slight overlap of the sections already tested to assure that the entire length of matting will be tested. This is accomplished by adjusting the rotation imparted by the motor for roller 65. Rotation of such motor rotates the endless belt 74 the prescribed distance. The mat material resting between rollers 68 and 98 will be advanced and the matting will be wound up onto roll 90 since roll 90 is frictionally resting on the belt 74. The mat material is advanced such that the portion of the mat material on roller 56 which is between plates 46 and 47 is advanced to be between plates 47 and 54 while the tested portion between platens 46 and 52 now overlies roller 56 and a new untested portion lies between platens 46 and 52. The operation will proceed until the entire roll of matting from roller 20 is expended; however, a second roll of matting is placed onto the rollers 21 and 22 and spliced to the trailing end of the prior matting roll to facilitate uninterrupted passage through the test chamber 30.

Various modifications are contemplated and may obviously be resorted to by those skilled in the art without departing from the described invention, as hereinafter defined by the appended claims, as only a preferred embodiment thereof has been disclosed.

We claim:

1. An apparatus for the testing of the electrical non-conductivity of a rubberized mat comprising support means having a forward portion and a rearward portion, at least two pairs of spaced flat electrode plates mounted on said support means intermediate of said forward and rearward portion, said plates are vertically disposed, power operated means mounted on said support means and interconnected to one of said plates in each of said pairs of electrode plates for moving said one plates respectively from a vertical storage position into a position closely adjacent to one of a remaining plates in each pair of plates to provide a small gap therebetween for contact with a thin mat suspended therebetween, means for applying a voltage to said one of said moveable electrode plates, and means on said support means for feeding mat material from said forward portion for windup on a take-up roll mounted on said rearward portion and for movement between said pairs of electrode plates.

2. An apparatus for the testing of the electrical non-conductivity of a rubberized mat as set forth in claim 1 wherein said means for feeding said mat includes an idler roll means mounted on said support means for redirecting said mat from one of said two pairs of plates to the other one of said pairs of plates.

3. An apparatus for the testing of the electrical non-conductivity of a rubberized mat as set forth in claim 2 wherein each of said pairs of plates have an exit portion and an entrance portion and the distance from the exit portion of one pair of plates to the entrance portion of the other pair of plates over said idler roll means is substantially equal to the vertical height of said pairs of plates.

4. An apparatus for the testing of the electrical non-conductivity of a rubberized mat as set forth in claim 3 wherein said means for feeding said mat includes a pair of spaced rollers with an endless belt thereon, said belt having a conveying run for receiving mat material from said pairs of plates for directing such mat material to said take-up roll, said take-up roll has its peripheral surface resting on said belt to facilitate the windup of matting material thereon.

5. An apparatus for the testing of the electrical non-conductivity of a rubberized mat as set forth in claim 4 wherein said one moveable electrode plate in each of said pairs are pivotally supported for movement in a horizontal direction to provide said gap between an adjacent one of said electrode plates.

* * * * *